(12) United States Patent
Purser et al.

(10) Patent No.: US 7,414,249 B2
(45) Date of Patent: Aug. 19, 2008

(54) BROAD ENERGY-RANGE RIBBON ION BEAM COLLIMATION USING A VARIABLE-GRADIENT DIPOLE

(76) Inventors: Kenneth H. Purser, 360 N. Emerson Rd., Lexington, MA (US) 02420; Norman L. Turner, 911 Orchid Point Way, Vero Beach, FL (US) 32903

( * ) Notice: Subject to any disclaimer, the term of this patent is extended or adjusted under 35 U.S.C. 154(b) by 174 days.

(21) Appl. No.: 11/289,863

(22) Filed: Nov. 30, 2005

(65) Prior Publication Data
US 2006/0197029 A1 Sep. 7, 2006

Related U.S. Application Data

(60) Provisional application No. 60/631,655, filed on Nov. 30, 2004.

(51) Int. Cl.
*H01J 3/20* (2006.01)
*H01J 37/14* (2006.01)
(52) U.S. Cl. .................. 250/396 ML; 250/492.21; 335/213
(58) Field of Classification Search ............... None
See application file for complete search history.

(56) References Cited

U.S. PATENT DOCUMENTS

| | | | |
|---|---|---|---|
| 4,578,589 A * | 3/1986 | Aitken | 250/492.2 |
| 5,350,926 A | 9/1994 | White et al. | 250/492.21 |
| 5,554,827 A | 9/1996 | Oda | 178/18.02 |
| 5,736,743 A | 4/1998 | Benveniste | |
| 5,814,819 A | 9/1998 | Sinclair et al. | 250/492.21 |
| 5,834,786 A | 11/1998 | White et al. | 250/492.21 |
| 6,329,650 B1 | 12/2001 | Dudnikov | 250/251 |
| 6,403,967 B1 * | 6/2002 | Chen et al. | 250/396 ML |
| 2006/0113494 A1 | 6/2006 | Chen et al. | |

OTHER PUBLICATIONS

Optics of Charged Particles; Hermann Wollnik; 6-pages; 282-287.

* cited by examiner

*Primary Examiner*—Jack I Berman
(74) *Attorney, Agent, or Firm*—Nields & Lemack (57) ABSTRACT

A method and apparatus satisfying growing demands for improving the intensity of implanting ions that impact a semiconductor wafer as it passes under an ion beam. The method and apparatus are directed to the design and combination together of novel magnetic ion-optical transport elements for implantation purposes for combating the disruptive effects of ion-beam induced space-charge forces. The design of the novel optical elements makes possible: (1) Focusing of a ribbon ion beam as the beam passes through uniform or non-uniform magnetic fields; (2) Reduction of the losses of ions comprising a d.c. ribbon beam to the magnetic poles when a ribbon beam is deflected by a magnetic field.

20 Claims, 9 Drawing Sheets

A Ribbon-Beam Implanter

FIGURE 9: A TRIPLET 70° COLLIMATOR

BROAD ENERGY-RANGE RIBBON ION BEAM COLLIMATION USING A VARIABLE-GRADIENT DIPOLE

This Application claims priority to U.S. provisional patent application Ser. No. 60/631,655 filed Nov. 30, 2004 entitled "Broad Energy-Range Ribbon Ion Beam Collimation Using a Variable-Gradient Dipole" the disclosure of which is incorporated herein by reference in its entirety.

FIELD OF INVENTION

The disclosed methods and apparatus relate generally to the construction and use of magnetic focusing and correction elements for modifying the intensity distribution of ions within ribbon beams and more particularly to the introduction of magnetic-field modification coils that can be added to uniform and non-uniform field magnetic dipole deflectors for providing auxiliary variable magnetic field focusing and the reduction of the effects of space-charge forces.

BACKGROUND OF THE INVENTION

The process of ion implantation is a critical manufacturing element used by the semiconductor industry. Implantation makes possible precise modification of the electrical properties of well-defined regions of a semiconducting work-piece by introducing selected impurity atoms, one by one, with a velocity such that they penetrate the surface layers and come to rest at a specified depth below the surface. The characteristics that make implantation such a useful processing procedure are threefold: First, the concentration of the introduced charged dopant atoms can be accurately measured by straight-forward integration of the incoming electrical charge delivered to the work-piece; secondly, the patterning of dopant atoms can be precisely defined using photo-resist masks; finally, the fabrication of layered structures becomes possible by varying the ion energy.

The ion species used for silicon implantation include arsenic, phosphorus, germanium, boron and hydrogen. The required implant energies range from below 1 keV (kiloelectron volts) to several hundred keV. Ion currents used range from microamperes to multi-milliamperes. Projecting to the future, demands are for greater productivity (elevated ion intensities); implantation at energies well below 1 keV; improved precision of uniformity and ion-incidence angle-control at the wafer.

During the last decade there has been an industry shift towards the use of D.C. ribbon-beams. This technology arranges that dopant ions arrive at a semiconducting wafer as part of a uniform-intensity beam that is organized into a long, small-height stripe that simultaneously implants uniformly the whole width of a semiconductor wafer. This geometry makes possible uniform implantation of a wafer during a single pass under the ribbon beam. The advantages of ribbon beam technology are substantial: (1) Batch implantation of multiple wafers and the use of large spinning discs is no longer necessary as the energy density at the wafer is low. (2) Wafers move slowly along a single linear path, avoiding issues of damage to delicate circuit components related to collision of heavy particles that arrive at the wafer surface.

U.S. Pat. No. 5,350,926 entitled "High current ribbon beam ion implanter" and U.S. Pat. No. 5,834,786, entitled "Compact high current broad beam ion implanter", both issued to N. White et al., present aspects of ribbon beam technology. Implanters, generally designed according to these principles, are manufactured by Varian Semiconductor Equipment Associates of Gloucester, Mass.

Figure 2:
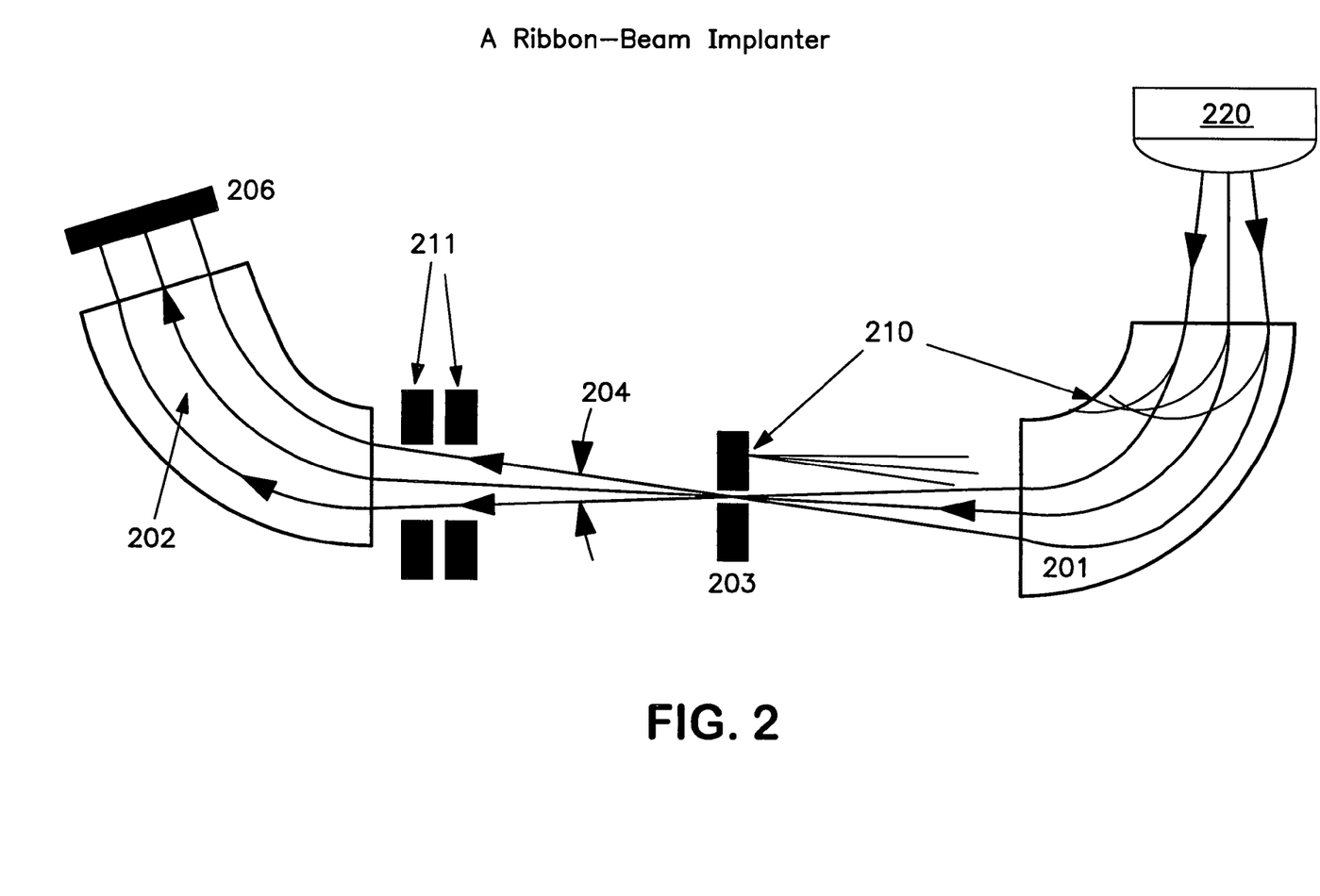
FIG. 2 Optical Schematic for a Simplified Ribbon Beam Implanter.

Referring to FIG. 2 it can be seen that in a typical ribbon beam tool a first magnetic deflector directs wanted-mass ions through a mass-resolving aperture where unwanted species from the ion source are rejected. Downstream of this aperture the emitted fan-shaped beam, now comprising only wanted ions, is parallelized by a second magnet and transformed to the ribbon length needed for implanting a specific wafer diameter. A deceleration system beyond the mass rejection aperture is included to reduce the energy of ions arriving at the wafer; the purpose being to allow the use of ion source extraction energies that are best suited for efficient source extraction and high transmission efficiency through the mass-resolving aperture.

In a ribbon beam implanter the control of space charge is a central issue. These effects are manifest mainly downstream of the deceleration region and are particularly troubling in the region of the second magnetic deflector where the presence of a magnetic field makes it difficult for the beam potential to trap the necessary neutralizing electrons: Captured electrons have difficulty moving across the magnetic field lines but can easily escape to the poles unless some form of electron trapping is present. Also, there is evidence that electron temperatures grow within magnetic fields further increasing electron losses. Thus, as a consequence of inadequate neutralization, the boundaries of the beam tend to expand allowing ions to be intercepted at the magnet poles or at the walls of the vacuum chamber.

Space charge problems have been recognized since the days of the Manhatten Project's development of the Uranium Bomb. An historical review, including the impact of space charge on that project, has been written by William E. Parkins and published on page 45 of the March 2005 edition of the magazine Physics Today. Further background for these processes can be found in a book entitled 'Large Ion Beams' written by A. T. Forrester and published by John Wiley and Sons in 1988. The above referenced book presents data and calculations on pages 139 to 153 concerning the manner in which ions 'peel away' from the outside of a drifting low-energy ion beam. In addition, data is included concerning the difficulties of achieving space charge neutralization within magnetic fields and the manner in which the ion-beam potential is raised as it passes through a magnetic field. Other authors who discuss space charge effects include V. Dudnikov in U.S. Pat. No. 6,329,650 and F. Sinclair, et al. in U.S. Pat. No. 5,814,819.

The solution which provides at least partial neutralization of the effects of space-charge expansion depends upon the fact that the same electric field distribution that causes the boundaries of a positive ion beam to expand because of space-charge effects is also an electric field distribution that attracts negative ions or electrons towards the center of an ion beam. However, even when created within the beam potential itself, these electrons tend to concentrate near the center of the positive ion beam leaving peripheral regions somewhat short of electrons, causing a tendency for ions to 'peel-away' from the outer edges of a ribbon beam. This peeling effect will be accentuated by the fields generated between image charges at the surface of a narrow vacuum envelope and non-neutralized positive ions within the beam itself.

In the energy range above ~15 keV interactions between fast beam ions and residual gas molecules usually provides sufficient secondary electrons that the space-charge density of the ion beam is largely neutralized. However, magnets whose focusing properties are satisfactory for deflecting ion beams having energy above ~15 keV may not provide acceptable transmission in the energy region below 5 keV, due to the above space charge effects. Additional magnetic field components may be needed for compensating residual space charge effects and for improving beam transmission through magnetic fields, the central theme of the present patent disclosure.

SUMMARY

Historically, the design of most existing commercial implanters includes magnetic deflectors that have predetermined ion focusing properties. These properties are established by the shapes of the coils and the magnet poles and generally can only be adjusted in a minor way, if at all, during implanter operation. Thus, when space-charge forces cause an expansion of the outer beam boundaries and consequent ion interception at the vacuum chamber or magnetic poles there is no procedure for introducing compensating compression forces.

The present patent disclosure describes a method and apparatus for superimposing variable magnetic focusing fields onto a uniform or indexed dipole deflecting field. These additions, thought of as perturbations to the main dipole field, are designed to introduce compression effects that provide approximate compensation for out-of-the-median-plane space charge expansion forces present in large-width ribbon beams. (Increases in ribbon length can be adjusted using other procedures). It will be recognized by those familiar with the art that, provided saturation does not occur, the magnetic fields necessary to produce supplemental focusing can be adjusted with little effect on the underlying dipole contribution allowing such perturbing fields to be increased or decreased at will and be turned on only when required for low-energy operation.

It has previously been confirmed that such active focusing elements can be useful during magnetic mass analysis when compensation is needed for combating the disruptive effects of space charge. In a patent disclosure by V. M. Benveniste in U.S. Pat. No. 5,554,827 entitled "Method and Apparatus for Ion Beam Formation in an Ion Implanter" an apparatus for filtering unwanted particles from a narrow ion beam compensates space-charge effects by adding adjustable quadrupole fields to a basic dipole field. Space charge expansion is compensated for circular cross-section ion beams by superimposing blocks of independently adjustable magnetic quadrupole fields along the centerline of the deflected ion beam locus, defined by the dipole field needed for conventional mass separation. However, when the transverse dimensions of the ion beam become comparable to the radius of curvature in the dipole field, as is the case for a broad ribbon beam, the above quadrupole field method does not have desirable linear optical transport properties.

Both positive and negative quadrupole and sextupole focusing fields have been widely used as beam transport elements. Techniques for introducing selected multipole field components into a single beam transport component has been described in an article entitled "The design of magnets with non-dipole field components", authored by N. White et al. and published in the journal Nuclear Instruments and Methods, volume A258, (1987), pages 437-442. A supplementary publication authored by Harald A. Enge entitled 'Deflecting Magnets', found on pages 203-264 of Volume II of the book entitled 'Focusing of Charged Particles', edited by A. Septier, and published by Academic Press (1967), describes the optical properties of indexed magnets.

The introduction of variable positive focusing in the y-direction of an indexed collimating magnet is the objective of the present invention. As background the above referenced article by Enge points out that if the deflecting magnetic field at the median plane, B(r), has the form $$B(r) = B_0 (r/R_0)^{-n}$$

the optical transfer characteristics are identical to those of linear optical lenses. [Here, $B_0$ is the field at the central trajectory (at radius $R_0$), r is the radius where the field is measured and n is the index of the field-gradient]. When n=0 the deflecting magnetic field is uniform; when n is made negative, defocusing is introduced to trajectories traveling in the median plane and positive focusing is introduced to trajectories traveling in planes at right angles to the median plane (the y-direction); when n is positive focusing is reversed.

In the present invention, which is primarily related to efficient collimation of large width ribbon beams, pole-face windings have been introduced to modify the basic dipole field index and add additional variable positive focusing in the y-direction. The pole-face windings consist of a multiplicity of different area coils, (ampere-turn generators), that are mounted on or recessed into the pole surfaces. In the preferred embodiment the shape of an individual coil is defined by a single conductor oriented approximately along the ion-beam path with its ends being coupled to radial conductors that extend beyond the inside curved boundaries of the magnetic pole. Here, the radial conductors are connected to a suitable power source or connected in series or parallel with other coils. If necessary, individual coils may consist of several turns connected in series or parallel to increase ampere turns and thus the magnetic field gradient developed across the pole.

The key to introducing a supplementary field gradient is that the ensemble of subsidiary windings do not completely overlap each other but rather are wound as a stepped structure across the whole width of the magnet pole with the maximum coil overlap and thus the additional focusing magnetic field being a maximum on the inside of the curve and a minimum at the outside. The spacing between windings establishes the local shape of the n-value gradient which those skilled in the art will recognize does not have to be identical to that of the underlying dipole index. In this manner, the uniform magnetostatic potential difference between the poles of the underlying dipole field is modified to become a distribution that varies as a function of the radius, producing a variable field distribution that enhances or subtracts from the in-built focusing of the underlying indexed-dipole collimation magnet.

While an aberration-corrected single-index magnet is most appropriate design for the collimator magnet shown in FIG. 2 it will be recognized by those skilled in the art that by arranging multiple regions along the ion path where the n value of a deflection magnet changes at least once from positive to negative, or vice versa, overall positive focusing can be introduced that will simultaneously provide positive focusing in both the median plane and the direction at right angles.

BRIEF DESCRIPTION OF THE DRAWINGS

For better understanding of the present invention, reference is made to the accompanying drawings which are incorporated herein by reference.

DETAILED DESCRIPTION

Figure 1:
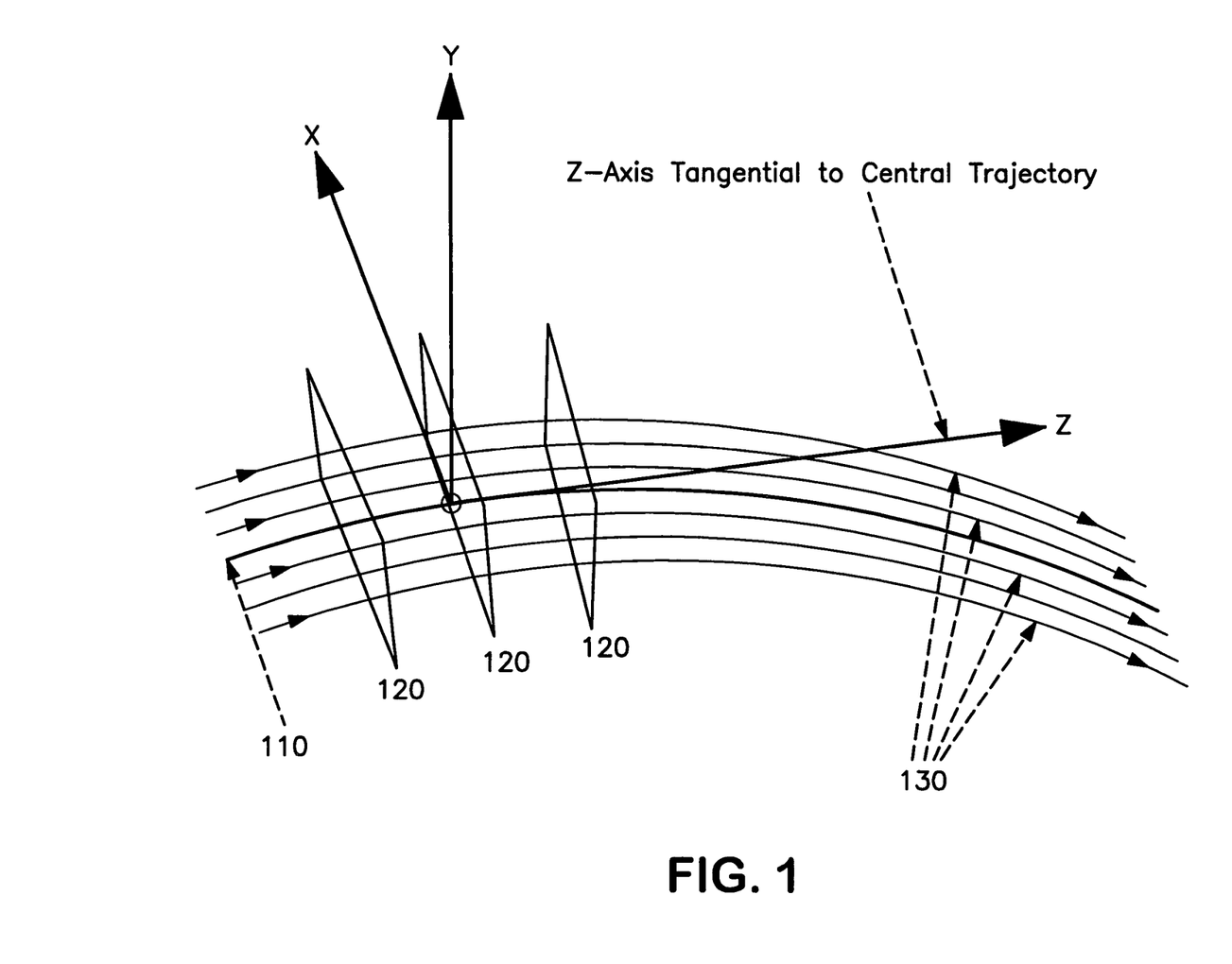
FIG. 1 A Beam Coordinate System

FIG. 1 illustrates the beam coordinate system used in the following discussions. The X-axis is always aligned with the front surface of the ribbon-beam, 120, and along the beam's long axis. The Z-axis is tangential to the central trajectory of the ribbon beam, 110, and is always coincident with the central trajectory. At each point along the beam path the orthogonal Cartesian Y-axis also lies in the surface, 120, and along the ribbon beam's narrow dimension.

FIG. 2 presents a schematic of the preferred embodiment of a D.C. ribbon-beam implanter. It can be seen that there are two magnetic deflections along the beam path, 201 and 202. The first magnetic deflection, 201, directs wanted-mass ions leaving the ion source, 220, through a mass-resolving aperture, 203. Unwanted species, 210, are rejected at the walls of the vacuum chamber or at the mass-resolving aperture, 203. The selected ions, 204, are directed into the succeeding optical elements, 211 and 202, comprising a deceleration stage, 211, and a collimating magnet, 202. The collimating magnet, 202, rejects high-energy neutral particles generated in the deceleration gap. It also provides the positive focusing needed for transforming the diverging ion beam passing through the mass selection slit, 203, to substantially parallel trajectories at the wafer implantation location, 206.

Referring again to FIG. 2 it can be seen that the wanted ions leaving the source pass through the opening between the jaws of the mass rejection slits, 203, to form a well-defined source of wanted ions from which almost all of the background particles, 210, have been removed. The opening between the mass rejection slits, 203, is shaped to match the emittance of the ion beam; namely, a narrow cross section of the beam in the horizontal dispersive plane and a tall aperture at right angles in the non-dispersive direction. The transmitted beam through this slit has the form of a uniform fan when viewed from above the x-z plane. The fan of ions, 204, subtends an angle at the mass slit necessary to form the desired ribbon-beam length at the wafer plane, 206. In the out-of-plane direction the trajectories of ions transmitted through the aperture 203, are substantially parallel to the x-z plane. On leaving the mass resolving slit, 203, the ions drift for a short distance and then enter the deceleration region, 211. Here, ions are retarded to the energy required for implantation at the wafer, 206. An important function of this deceleration stage, 211, is to allow extraction of ions from the ion source at energies that are best suited for efficient ion-source extraction and high transmission efficiency through the mass resolving slit.

Referring again to FIG. 2 it can be seen that the ions leaving the deceleration region, 211, are directed into the collimator magnet, 202. Here, the positive optical strength of this magnetic deflector, 202, transforms the fan-shaped beam to a group of parallel trajectories required for implantation at the wafer, 206.

Figure 3:
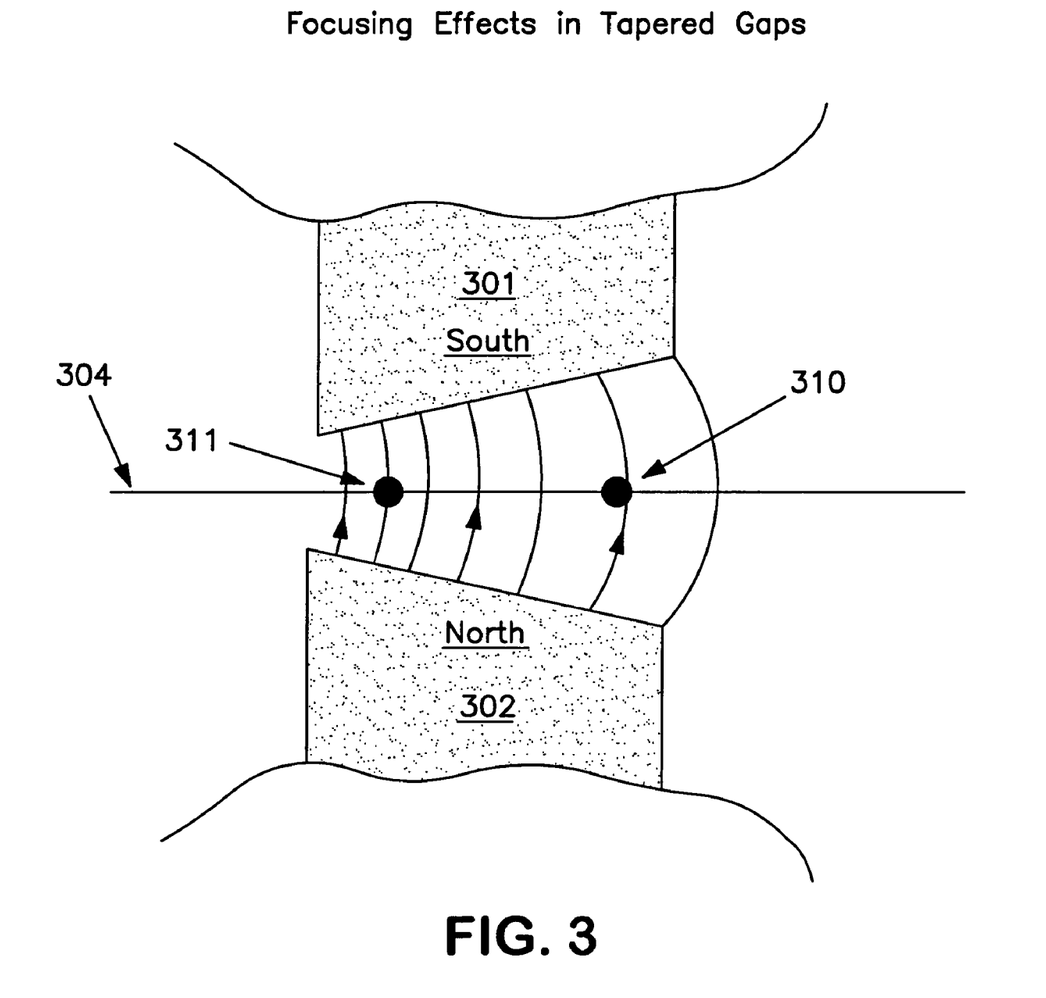
FIG. 3 Tapered Gap Focusing

FIG. 3 shows how focusing that can be introduced in a deflection magnet if the radial gap between the poles, 301, 302, is tapered radially. It can be seen that, because the pole surface represents an equipotential, in the z-direction (out of the page) the field acting on the trajectory 310, is less than that acting on the trajectory 311, causing the deflection radius of curvature to be greater for trajectory 310 than for 311. Thus, focusing in the x-direction is weakened, compared to that observed in a uniform field magnet; negative focusing has been introduced to the median plane trajectories. In the vertical direction it can be seen that, because of symmetry, the magnetic field lines, B, must cross the median plane, 304, normally. Away from this plane, in the y-direction, an x-component of the deflecting field develops with this x-component increasing linearly with the y-distance away from the median plane, 304, changing sign at the median plane. The effect is the production of a focusing field component in the direction along the dipole field lines that increases linearly with distance from the median plane. It can be seen that as positive focusing in the x-z plane is reduced, positive focusing in the y,z plane increases correspondingly.

Referring again to FIG. 3, it should be emphasized that ability to actively vary the index of the magnetic deflection field—the shape of the tapered opening between the poles—can be used to provide a compensating compressive effect upon ion beams that are expanding towards the poles and losing ions there because of the effects of space-charge forces.

It will be recognized by those skilled in the art that by arranging that, along the ion path of a deflection magnet, the field index of the tapered pole gap changes at least once from positive to negative or negative to positive, positive focusing can be introduced in both the median plane and the direction at right angles.

Figure 4:
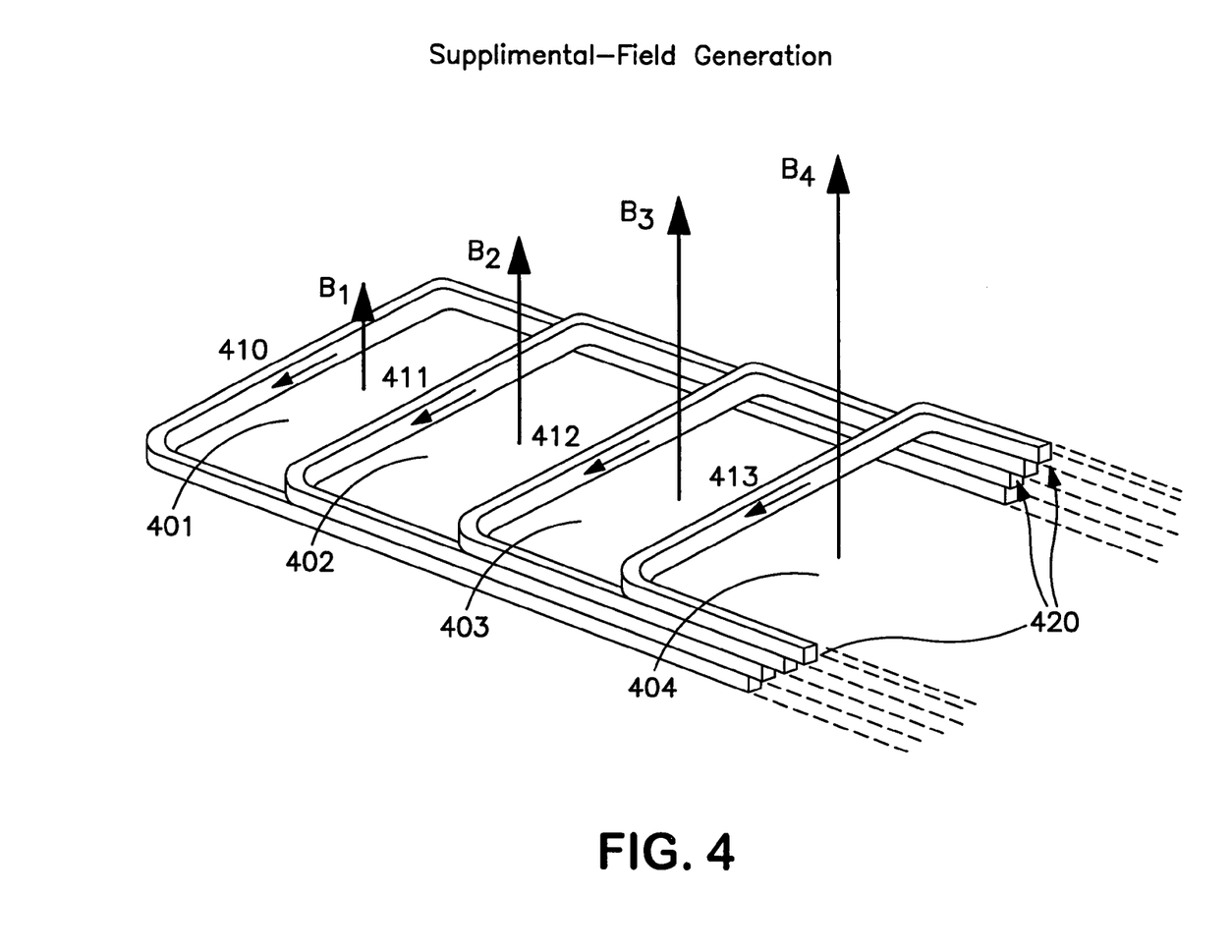
FIG. 4 Supplemental Field Generation

FIG. 4 shows an embodiment of the principles used to produce the field distribution needed for introducing variable focusing of a ribbon beam and the beam compression needed to minimize space-charge effects. It can be seen that a series of ever decreasing-area coils, 401, 402, 403, 404, etc, each enclosed by a conductor, or a plurality of conductors having the same shape, are superimposed layer by layer, so that the ampere turns generated by each layer add together in those regions where layers overlap to produce a perturbing field. Arrangements of such overlapping coils can be used to modify the base dipole-field index and add variable positive focusing in the y-direction.

The key to introducing such supplementary field gradients is that the ensemble of subsidiary windings do not completely overlap each other but rather are wound as a stepped structure across the whole width of the magnet pole. In one embodiment the overlapping coils will have a maximum number sections overlapping on the inside of the ion beam deflection curve and a minimum number of sections along the outside of the curve.

The preferred embodiment involves the use of the above field generating technology but extends the concept in-as-much as the zero perturbing field regions are present along the ribbon-beam center-line, instead of at one edge of the ribbon beam as described above. Using this geometry, two supplementary field maxima are generated: One is on the inside and the other on the outside of the ribbon beam. It should be emphasized that the current direction through coils on the two sides are such that the sign of the supplementary magnetic field perturbations are positive on one side of the central trajectory and negative on the other. These two maxima can be controlled independently to introduce higher order deflections. Those skilled in the art will recognize that even higher order contributions can be introduced by individually varying the current passing through individual loops.

Referring again to FIG. 4 it can be seen that an increasing field perturbation is typically defined by a group of single conductors, 410, 411, 412, 413 etc. that are approximately oriented along the direction of the ion-beam. The ends of each of these conductors are coupled to radial wires, 420, that extend across the width of the underlying magnetic pole to regions outside the curved boundaries of the magnetic pole.

Here, the radial conductors are connected to a suitable power source or connected in series or parallel with other coils. In the preferred embodiment the conductor 410 would be close to the central trajectory. Referring again to FIG. 4 it can be seen that a growing magnetic B-field pattern is created for equal loop currents when the spacing of the conductors 410, 411, 412 and 413 etc. increases linearly as a function of radial location. However, it should be noted that non-uniform spacing can lead to the introduction of sextupole and octopole contributions. It should also be noted that it is possible to power the above element individually or in groups making possible active introduction of higher order corrections. It can be seen that the uniform magnetostatic potential difference between the poles of the underlying dipole field is thus modified by the supplementary coils which produce a distribution that can be varied as a function of the radius. Such changes enhance or subtract from the in-built focusing index of the underlying dipole magnet.

Figure 5:
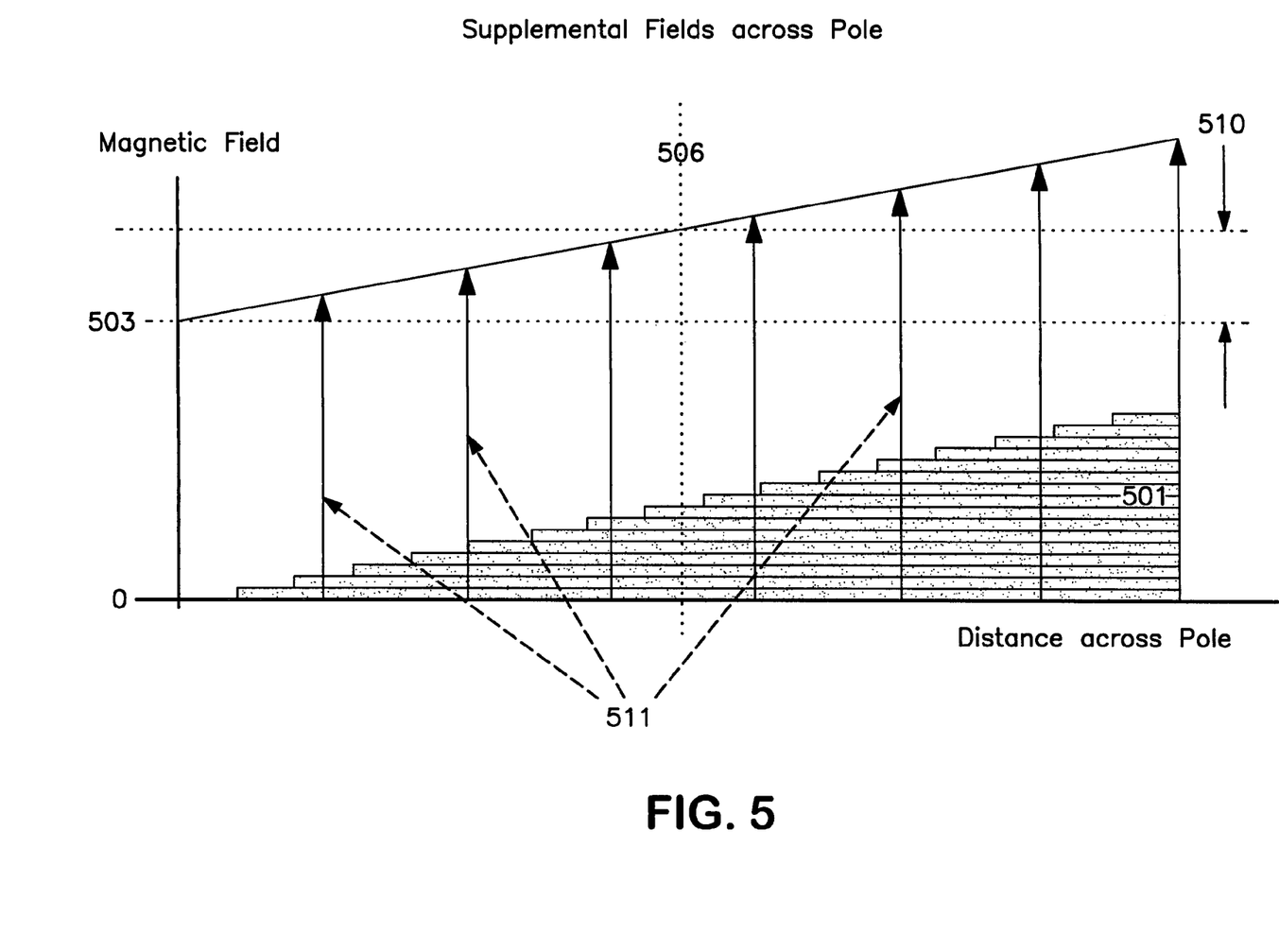
FIG. 5 Single Supplemental Field Distribution

FIG. 5 shows schematically the method for generating supplemental magnetic fields that complements an underlying uniform dipole field. As an example, the underlying field for a uniform magnetic field would have the value shown by the dotted line, 503, across the width of the pole. The stacking of the coils is illustrated schematically as the layered pattern, 501, to produce the total field vectors across the pole, 511. It can also be seen that in its simplest embodiment the auxiliary fields introduce an additional component to the dipole field at the center of the pole, 506, having the differential increase, 510.

Figure 6:
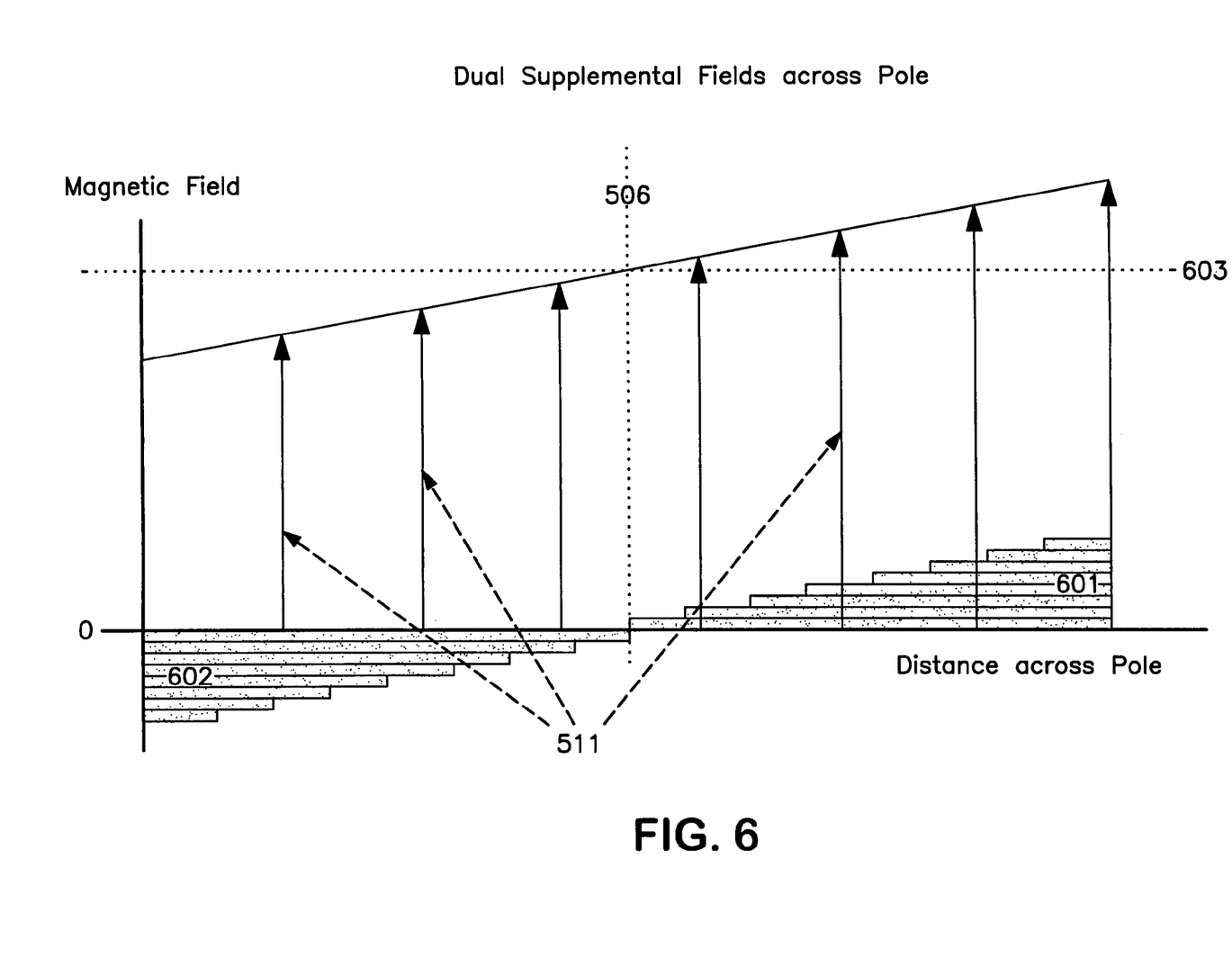
FIG. 6 Dual Supplemental Magnetic Field Generation
FIG. 7 Pole-Face Windings
FIG. 8 A Doublet Collimator
FIG. 9 A Triplet Collimator

FIG. 6 shows a second embodiment. It will be seen that the stacked field generators, described previously in FIG. 4, are divided into two section which are placed end-to-end with zero height close to the central trajectory. The stacked generators, 601, have currents circulating in a direction that enhances the field, 603, developed by an underlying uniform-field dipole magnet. The second set, 602, are shown schematically below the magnetic-field zero line to indicate that the currents through these coils circulate in the opposite direction to that of the coils, 601, producing a further supplementary field pattern that reduces the underlying dipole field.

Figure 7:
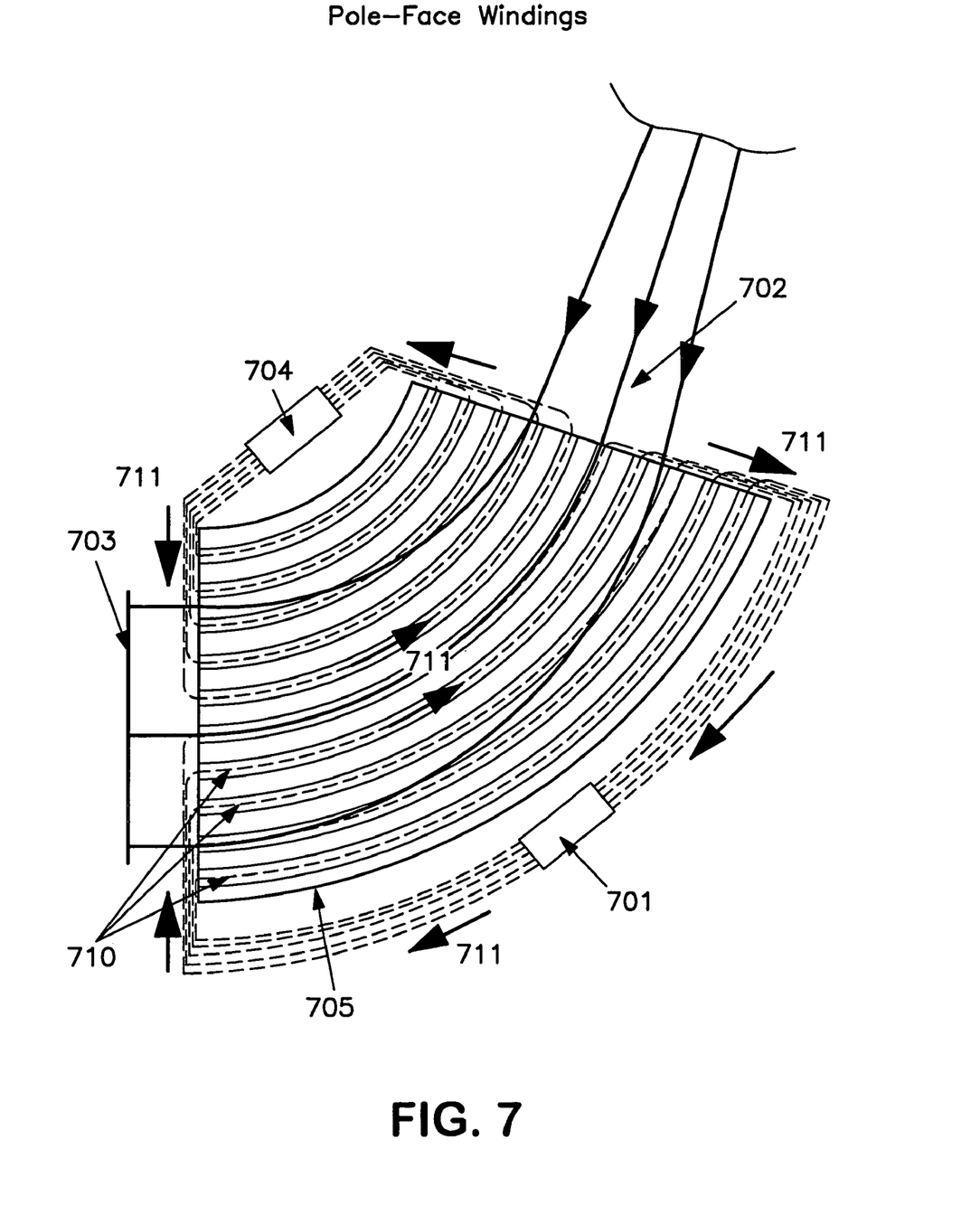

FIG. 7 shows the preferred embodiment as applied to wafer implantation, 703, 206. Variable supplementary focusing fields are added to the fields generated by an underlying indexed or uniform dipole magnet, 202, 705. It can be seen that the auxiliary magnetic-field generating coils are symmetrically disposed about the central beam trajectory, 702, and consist of a number of circumferential conductors mounted directly on the magnetic poles, 705, or recessed into shallow slots machined into these poles. The conductors located in trenches, 710, are connected to the power sources, 701, 704 by suitable radial current feeds located along the sides of the magnet pole, as shown. Those skilled in the art will recognize that it may be necessary to hide these conductors in a manner that arranges that residual fields be shielded from the beam. Through each of these coils, which may consist of several turns, currents circulate in the directions shown by the arrows, 711.

Figure 8:
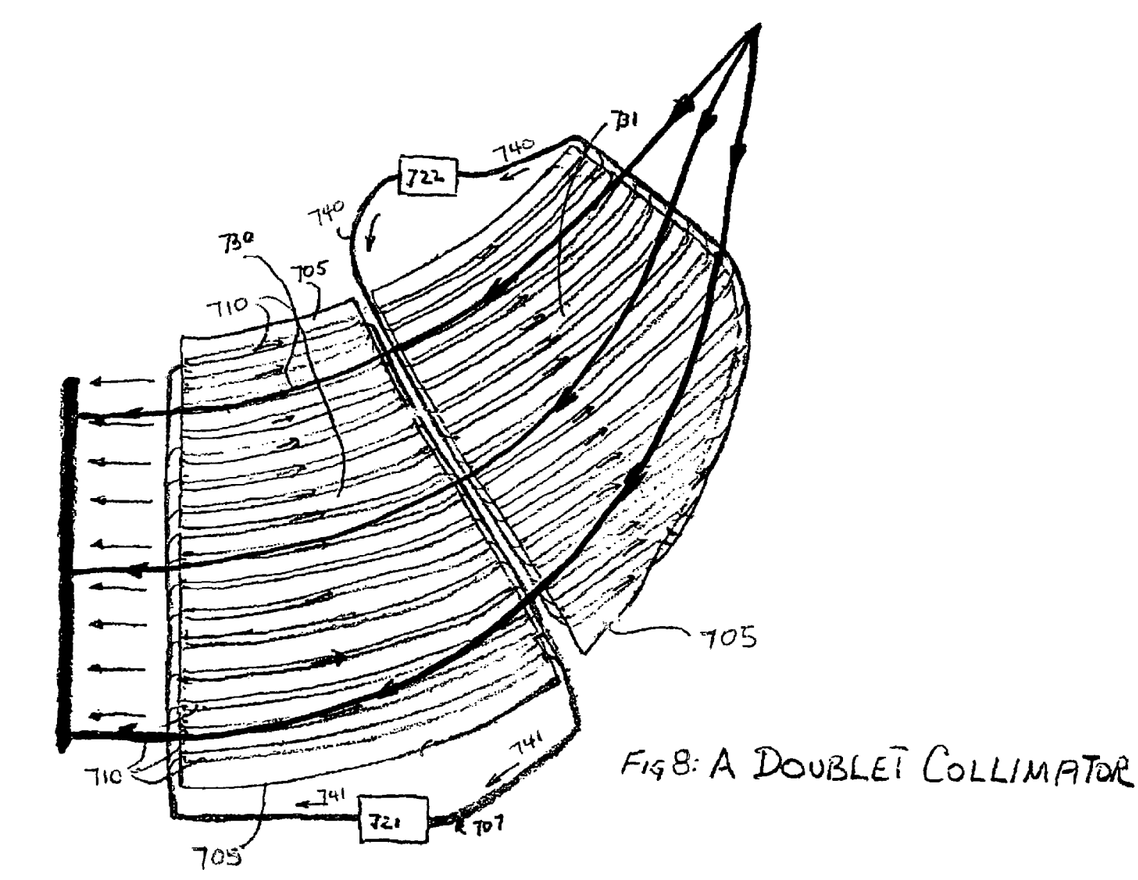

FIG. 8 shows the manner in which variable focusing fields can add to the uniform dipole fields of a collimator magnet. The technique employs a number of independent surface coils that are mounted directly onto the magnetic poles 705, or are recessed in shallow slots 710 machined into the poles 705. The auxiliary field distribution is produced by superimposing the changing magnetostatic potentials produced by a number of successively smaller overlapping coils superimposed onto the fundamental dipole field. Around each of these coils, which may consist of several turns, currents 740, 741 circulate as shown, producing the wanted auxiliary fields.

It can be seen that the largest coil extends between the pole edge and the distant pole edge. It can be seen that each of the auxiliary coils has a similar construction consisting of equi-spaced circumferential conductors that connect the two radial current feed conductors on both sides of each sub assembly 730, 731. The remaining connecting leg for each coil, which may include the current supply 721, 722, is located beyond the pole edge. For the auxiliary coils to produce additional positive focusing in the median plane of a single element 730 or 731, the auxiliary field in such an element must increase with radius and, thus, the common current return circuits is preferably located beyond the maximum radius, $R_{max}$. For increases in divergent focusing in the median plane, the reverse holds. In this case, it can be seen that the connecting circumferential legs are on the inside of the minimum pole radius $R_{min}$.

Referring again to FIG. 8, it can be seen that both types of focusing field are represented in each of the sections 730 and 731. It is well known to those skilled in the art that by arranging along the beam trajectory such a sequence of positive and negative field gradients, an ion optical array can be formed that can produce stigmatic focusing in both median and vertical planes.

Figure 9:
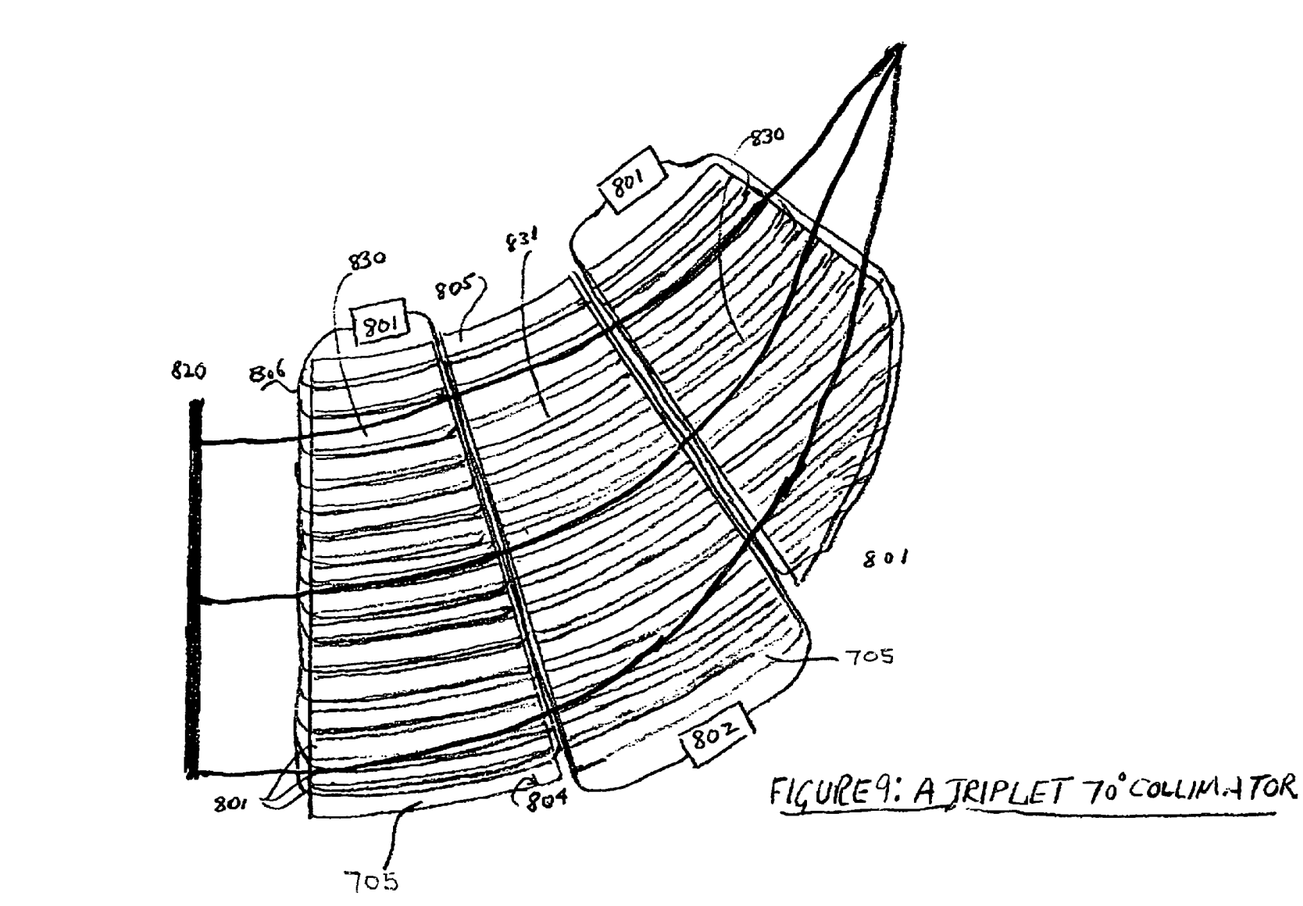

FIG. 9 shows the pattern of pole channels on the surface of a 70-degree deflection collimator magnet using a three-element focusing collimator—negative-positive-negative in the median plane. The advantage of adding the extra section is that the focal strengths can be equal in both x and y directions.

What we claim is the following:

1. A method for modifying a D.C. dipole magnetic field comprising: providing a plurality of regions, where each of said regions comprises a plurality of coils, each adapted to carry current, positioned within said D.C. dipole magnetic field; and energizing at least one of said plurality of coils in each of said regions, thereby producing an additional magnetic field superimposed on said D.C. dipole magnetic field such that the sign of the resulting magnetic field gradient in one of said regions is opposite the sign of the resulting magnetic field gradient in a second of said regions.

2. The method of claim 1, wherein said dipole magnetic field is produced using a north magnetic pole and a south magnetic pole, and said plurality of coils is positioned on the surfaces of said north and south magnetic poles.

3. The method of claim 1, wherein said dipole magnetic field is produced using a north magnetic pole and a south magnetic pole and said plurality of coils is positioned in apertures recessed into the surfaces of said north and south magnetic poles.

4. The method of claim 1, wherein said dipole magnetic field is non-uniform.

5. The method of claim 1, wherein said dipole magnetic field is uniform.

6. The method of claim 1, wherein each of said plurality of coils in at least one of said regions comprises a first and second feed conductor and a circumferential conductor, and wherein said feed conductors of all of said plurality overlap and the current in each of said plurality of coils creates a magnetic field in the same direction.

7. The method of claim 1, wherein said plurality of coils in at least one of said regions comprises a first portion and a second portion, and each of said plurality of coils comprises a first and second feed conductor and a circumferential conductor; wherein said feed conductors for said first portion of said plurality overlap; said feed conductors for said second portion overlap and the current in said first portion creates a magnetic field that is in the opposite direction of the magnetic field created by the current in said second portion.

8. An apparatus for modifying a D.C. dipole magnetic field, comprising: a plurality of regions, wherein each of said regions comprises a plurality of conductive coils, each adapted to carry current, positioned within said D.C. magnetic field; and a power controller for energizing at least one coil of said plurality of coils in each of said regions, to create an additional magnetic field superimposed on said D.C. dipole magnetic field, such that the sign of the resulting magnetic field gradient in one of said regions is opposite that sign of the resulting magnetic field gradient in a second of said regions.

9. The apparatus of claim 8, wherein said dipole magnetic field is produced using a north magnetic pole and a south magnetic pole and said plurality of coils is positioned on the surfaces of said north and south magnetic poles.

10. The apparatus of claim 8, wherein said dipole magnetic field is produced using a north magnetic pole and a south magnetic pole and said plurality of coils is positioned in apertures recessed into the surfaces of said north and south magnetic poles.

11. The apparatus of claim 8, wherein said dipole magnetic field is non-uniform.

12. The apparatus of claim 8, wherein said dipole magnetic field is uniform.

13. The apparatus of claim 8, wherein each of said plurality of coils in at least one of said regions comprises a first and second feed conductor and a circumferential conductor, and wherein said feed conductors of all of said plurality overlap and the current in each of said plurality of coils creates a magnetic field in the same direction.

14. The apparatus of claim 8, wherein said plurality of coils in at least one of said regions comprises a first portion and a second portion, and each of said plurality of coils comprises a first and second feed conductor and a circumferential conductor; wherein said feed conductors for said first portion of said plurality overlap; said feed conductors for said second portion overlap and the current in said first portion creates a magnetic field that is in the opposite direction of the magnetic field created by the current in said second portion.

15. An apparatus for providing corrective focusing for a diverging ion beam passing through a D.C. dipole magnetic field to form substantially parallel trajectories, comprising: a north magnetic pole and a south magnetic pole adapted to produce said D.C. magnetic field; a plurality of regions, at least one of said regions comprising a plurality of conductive coils, adapted to carry current, positioned within said D.C. dipole magnetic field; and a power controller for energizing at least one coil of said plurality of coils in at least one of said regions to create an additional magnetic field superimposed upon said D.C. dipole magnetic field such that the sign of the magnetic field gradient in one of said regions is opposite the sign of the magnetic field gradient in a second of said regions.

16. The apparatus of claim 15, wherein said plurality of coils in at least one of said regions is positioned on the surfaces of said north and south magnetic poles.

17. The apparatus of claim 15, wherein said plurality of coils in at least one of said regions is positioned in apertures recessed in the surfaces of said north and south magnetic poles.

18. The apparatus of claim 15, wherein each of said plurality of coils in at least one of said regions comprises a first and second feed conductor and a circumferential conductor, and wherein said feed conductor of all of said plurality overlap and the current in each of said polarity of coils creates a magnetic field in the same direction.

19. The apparatus of claim 15, wherein said plurality of coils in at least one of said regions comprises a first portion and a second portion, and each of said plurality of coils comprises a first and second feed conductor and a circumferential conductor; wherein said feed conductors for said first portion of said plurality overlap; said feed conductors for said second portion overlap and the current in said first portion create a magnetic field that is in the opposite direction of the magnetic field created by the current in said second portion.

20. The apparatus of claim 15, wherein said D.C. dipole magnetic field has a center of curvature, and said center of curvature divides said plurality of coils into a first portion and a second portion and the current in said first portion creates a magnetic field that is in the opposite direction of the magnetic field created by the current in said second portion.

* * * * *